US012677696B2

(12) United States Patent
    Leow

(10) Patent No.: US 12,677,696 B2
(45) Date of Patent: Jul. 7, 2026

(54) SEMICONDUCTOR DIE ASSEMBLIES WITH MOLDED SEMICONDUCTOR DIES AND ASSOCIATED METHODS AND SYSTEMS

(71) Applicant: Micron Technology, Inc., Boise, ID (US)

(72) Inventor: See Hiong Leow, Singapore (SG)

(73) Assignee: Micron Technology, Inc., Boise, ID (US)

( * ) Notice: Subject to any disclaimer, the term of this patent is extended or adjusted under 35 U.S.C. 154(b) by 585 days.

(21) Appl. No.: 17/675,972

(22) Filed: Feb. 18, 2022

(65) Prior Publication Data

US 2023/0268327 A1     Aug. 24, 2023

(51) Int. Cl.
    *H10W 90/00*      (2026.01)
    *H10W 74/00*      (2026.01)
    *H10W 74/01*      (2026.01)
    *H10W 74/10*      (2026.01)
    *H10W 90/20*      (2026.01)
    *H10W 90/24*      (2026.01)

(52) U.S. Cl.
    CPC ......... *H10W 90/00* (2026.01); *H10W 74/016* (2026.01); *H10W 74/117* (2026.01); *H10W 74/00* (2026.01); *H10W 90/20* (2026.01); *H10W 90/24* (2026.01); *H10W 90/724* (2026.01); *H10W 90/732* (2026.01); *H10W 90/734* (2026.01); *H10W 90/752* (2026.01); *H10W 90/754* (2026.01)

(58) Field of Classification Search
    CPC ....... H01L 21/565; H01L 24/16; H01L 24/48;

H01L 2224/16225; H01L 2224/32145; H01L 2224/32225; H01L 2224/48148; H01L 2224/48229; H01L 25/105; H01L 25/0652; H01L 2225/0651
    USPC ....................................................... 257/686
    See application file for complete search history.

(56) References Cited

U.S. PATENT DOCUMENTS

| | | | | | |
|---|---|---|---|---|---|
| 9,240,393 | B2 * | 1/2016 | Yu | ......................... | H01L 23/3135 |
| 2004/0227240 | A1 * | 11/2004 | Bolken | .................... | H01L 25/03 257/E25.011 |
| 2006/0175715 | A1 * | 8/2006 | Hirose | ................ | H01L 25/0657 257/E25.023 |
| 2011/0175222 | A1 * | 7/2011 | Kim | ..................... | H01L 23/3128 257/737 |
| 2014/0070428 | A1 * | 3/2014 | Tanimoto | ................ | H01L 25/50 257/777 |
| 2014/0138827 | A1 * | 5/2014 | Meyer | ................. | H01L 23/5389 257/737 |

(Continued)

*Primary Examiner* — Brian Turner
(74) *Attorney, Agent, or Firm* — Dorsey & Whitney LLP

(57) ABSTRACT

Semiconductor die assemblies with molded semiconductor dies, and associated methods and systems are disclosed. In some embodiments, a semiconductor die assembly includes a package substrate and a controller die attached to the package substrate. The semiconductor die assembly comprises a mold structure including the controller die and having a surface facing away from the package substrate. The controller die may be completely encased within the mold structure. Further, one or more stacks of semiconductor dies (e.g., memory dies) are attached to the surface of the mold structure. Accordingly, the semiconductor die assembly does not include support structures for the stacks of semiconductor dies attached above the controller die.

19 Claims, 9 Drawing Sheets

(56) References Cited

U.S. PATENT DOCUMENTS

| | | | |
|---|---|---|---|
| 2015/0069632 A1* | 3/2015 | Ozawa .............. | H01L 23/49838 |
| | | | 257/777 |
| 2015/0221624 A1* | 8/2015 | Ye .................... | H10W 72/0113 |
| | | | 257/777 |
| 2018/0130782 A1* | 5/2018 | Lee ......................... | H01L 24/48 |
| 2019/0341369 A1* | 11/2019 | Chang Chien ...... | H01L 23/3135 |
| 2020/0273783 A1* | 8/2020 | Sankman ................. | H01L 24/17 |
| 2021/0210397 A1* | 7/2021 | Kang .................. | H01L 23/5385 |

* cited by examiner

300

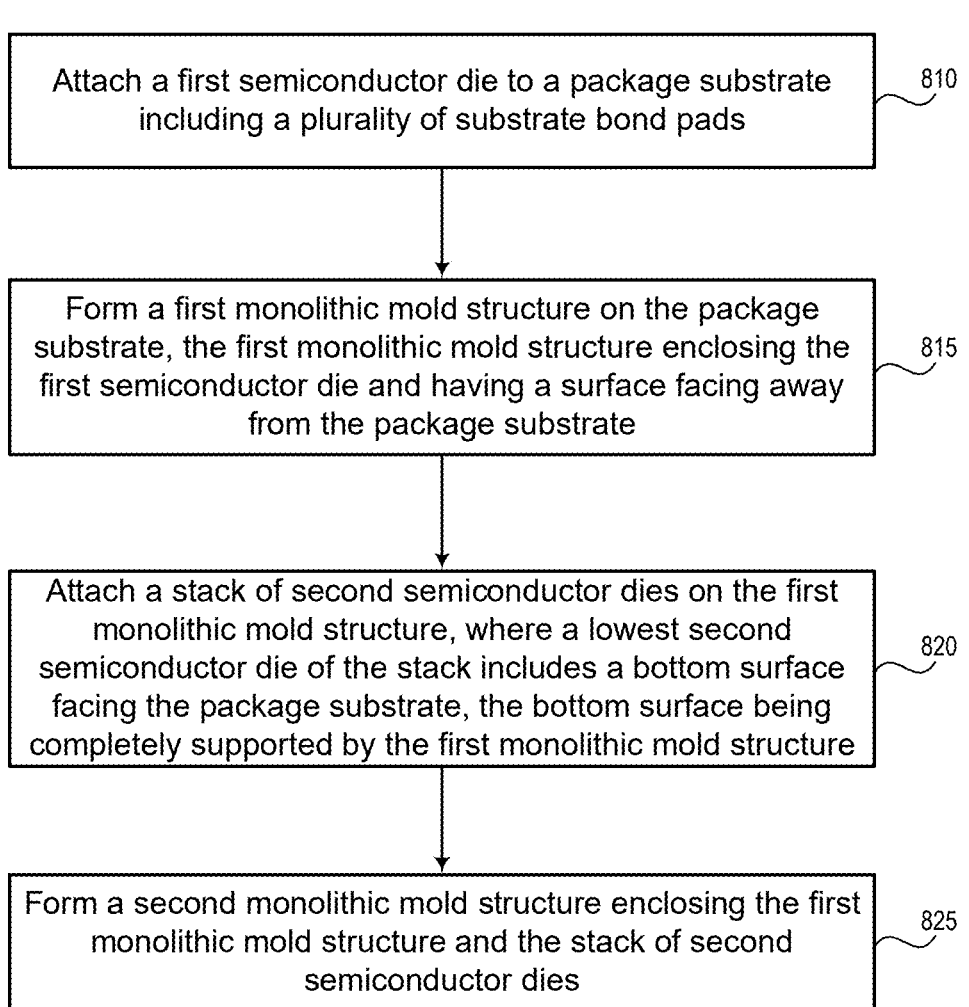

800

Attach a first semiconductor die to a package substrate including a plurality of substrate bond pads — 810

Form a first monolithic mold structure on the package substrate, the first monolithic mold structure enclosing the first semiconductor die and having a surface facing away from the package substrate — 815

Attach a stack of second semiconductor dies on the first monolithic mold structure, where a lowest second semiconductor die of the stack includes a bottom surface facing the package substrate, the bottom surface being completely supported by the first monolithic mold structure — 820

Form a second monolithic mold structure enclosing the first monolithic mold structure and the stack of second semiconductor dies — 825

*Figure 8*

SEMICONDUCTOR DIE ASSEMBLIES WITH MOLDED SEMICONDUCTOR DIES AND ASSOCIATED METHODS AND SYSTEMS

TECHNICAL FIELD

The present disclosure generally relates to semiconductor device assemblies, and more particularly relates to semiconductor die assemblies with molded semiconductor dies and associated methods and systems.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

Market pressures continually drive semiconductor manufacturers to reduce the size of die packages to fit within the space constraints of electronic devices, while also pressuring them to increase the functional capability of each package. One approach for increasing the processing power of semiconductor packages without substantially increasing the surface area occupied by the packages is to vertically stack multiple semiconductor dies on top of one another in a single package. In some cases, the semiconductor dies are stacked in a "zig-zag" pattern to increase a space above the bond pads with respect to a semiconductor die overlying above the bond pads. In some semiconductor packages, the thickness of the semiconductor dies are reduced to stack multiple semiconductor dies without increasing overall heights of the semiconductor packages.

BRIEF DESCRIPTION OF THE DRAWINGS

Many aspects of the present technology can be better understood with reference to the following drawings. The components in the drawings are not necessarily to scale. Instead, emphasis is placed on clearly illustrating the overall features and the principles of the present technology.

FIG. 8 is a flowchart of a method of forming a semiconductor device assembly in accordance with embodiments of the present technology

DETAILED DESCRIPTION

Figure 1A:
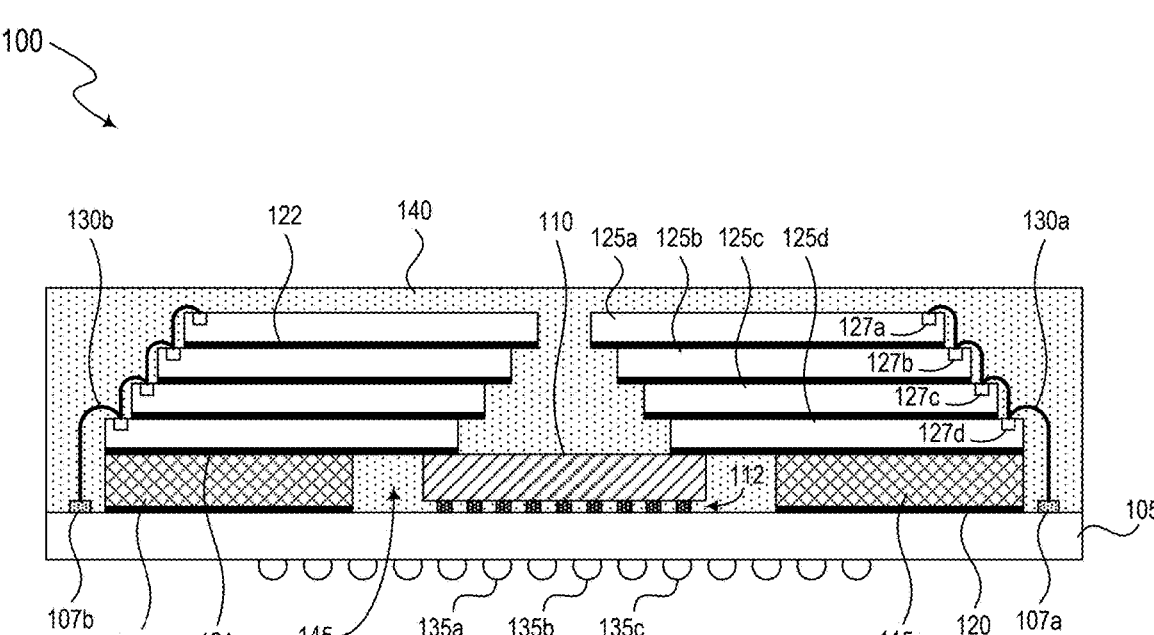
FIGS. 1A and 1B illustrate schematic diagrams of a semiconductor die assembly.

Specific details of several embodiments of semiconductor die assemblies with molded semiconductor dies, and associated methods and systems are described below. The term "semiconductor device or die" generally refers to a solid-state device that includes one or more semiconductor materials. Examples of semiconductor devices (or dies) include logic devices or dies, memory devices or dies, interface devices or dies, controllers, memory controllers, or processors (e.g., central processing unit (CPU), graphics processing unit (GPU)), field-programmable gate arrays (FPGAs), among others.

Such semiconductor devices or dies may include integrated circuits or components, data storage elements, processing components, and/or other features manufactured on semiconductor substrates (e.g., silicon substrates). Further, the term "semiconductor device or die" can refer to a finished device or to an assembly or other structure at various stages of processing before becoming a finished functional device. Depending upon the context in which it is used, the term "substrate" may include a semiconductor wafer, a semiconductor substrate, a package substrate, an interposer, a semiconductor device or die, or the like. Suitable steps of the methods described herein can be performed with processing steps associated with fabricating semiconductor devices (wafer-level and/or die-level) and/or manufacturing semiconductor packages.

Semiconductor die assemblies (e.g., multi-chip packages (MCPs)) include two or more kinds of semiconductor dies (devices), such as controller dies (memory controller dies, logic dies), memory dies (e.g., dynamic random access memory (DRAM) dies, Not-AND (NAND) memory dies, phase-change memory (PCM) devices, magnetoresistive random access memory (MRAM) dies), processors (e.g., graphics process units (GPUs), central process units (CPUs)), or the like. Semiconductor die assemblies for high-performance memory systems (e.g., high-bandwidth memory (HBM), hybrid memory cube (HMC)) may include a controller die attached to a package substrate and memory dies stacked on top of the controller die to reduce overall areas of the semiconductor die assemblies. If the controller die has a smaller footprint than the memory dies, one or more support structures (which may also be referred to as spacers or spacer structures) are deployed on a package substrate to provide mechanical support for the memory dies.

For example, a controller die is attached to the package substrate (e.g., using flip-chip technology) and one or more support structures are attached to the package substrate next to the controller die. The support structures may be attached to the package substrate using an adhesive film (e.g., a die-attach film (DAF), an adhesive layer, a die attach adhesive). The support structures are configured to have approximately the same height (including the thickness of the adhesive film) as the controller die. In this manner, the support structures, together with the controller die, can provide a surface, to which the memory dies can be attached—e.g., using DAFs. For high-speed memory systems, the placement of the controller die on the package substrate and signal routing around the controller die (e.g., layout of conductive traces coupled to the controller die) may play a significant role in determining speed performance of the memory systems.

The support structures may include a semiconductor material. In some embodiments, a semiconductor substrate (e.g., a silicon substrate) is diced to generate the support structures. The support structures may not perform any electrical function for the semiconductor die assembly, but are required to meet certain physical criteria. For example, thicknesses of the support structures are required to meet coplanarity specifications such that when more than one support structures are attached to the package substrate, a level surface can be provided for attaching semiconductor dies to the support structures. If the surface is not level (e.g., if the coplanarity specifications are not met), the semiconductor dies attached to the support structures may be subject to uneven stress, which in turn, may develop yield or reliability issues for the semiconductor die assembly.

In some cases, if a support structure is relatively short when compared to other support structures, the support structure may not be adequately attached to the semiconductor die—e.g., with the DAF. Such a support structure may result in encapsulating materials to penetrate into a gap between the support structure and the semiconductor die (or the DAF used to attach the semiconductor die) during subsequent molding process steps—e.g., mold ingression. The mold ingression tends to weaken bonding strength between the support structures and the semiconductor die. In some cases, bonding interfaces between the support structures and the semiconductor die delaminate as a result of the mold ingression.

In some embodiments, the support structures and the controller die, in combination with the memory dies attached to the support structures and the controller die, create space difficult for encapsulating materials to fill during the molding process steps. For example, placement of certain support structures may obstruct flowing of the encapsulating materials into the space. The space inadequately filled by the encapsulating material may be undesirable in view of the semiconductor dies above the space not having adequate support underneath.

Moreover, the process steps attaching the support structures to the package substrates consume part of the die attachment equipment capacity. In some cases, approximately 10% of the equipment capacity needs to be allocated to attach the support structures to the package substrates for manufacturing semiconductor die assemblies.

The present technology eliminates the support structures for semiconductor die assemblies, thereby simplifying the manufacturing process steps and alleviating various challenges associated the support structures. For example, process steps for dicing and attaching the support structure can be skipped—e.g., increasing the die attach equipment capacity as a result. Further, the coplanarity requirements for the support structures can be eliminated resulting in improved yield and reliability characteristics of the semiconductor die assemblies. Additionally, various parameters for manufacturing the semiconductor die assemblies can be improved, for instance, die attachment equipment utilization per hour (UPH), manufacturing variables appreciation (MVA), bill of materials (BOM), or the like.

In lieu of the support structures, semiconductor die assemblies in accordance with embodiments of the present technology comprise mold structures (e.g., with an encapsulating material) including controller dies. The mold structures may be formed after the controller dies are attached to the package substrate (e.g., using flip-chip technology). The controller dies may be completely embedded within the mold structures. Subsequently, one or more memory dies can be attached above the controller die—e.g., attached to the mold structure. The mold structures (which may also be referred to as monolithic mold structures) may also include lateral regions (peripheral regions, outer regions) next to the controller die, on which memory dies can be affixed. In this manner, the mold structure provides a level surface (even surface, flat surface, coplanar surface) above the controller die, to which memory dies can be attached—e.g., using an adhesive layer.

Subsequently, interconnects (e.g., bond wires) between the memory dies and the package substrate can be formed before forming an encapsulating structure for the semiconductor die assembly. The mold structure encasing the controller die, by providing an intermediate encapsulated structure, facilitates later applied encapsulating materials to form robust encapsulation for the semiconductor die assembly—e.g., absent inadequately filled space underneath the memory dies. Moreover, as the support structures are eliminated, placement of the controller die and the memory dies on the package substrate is expected to be more flexible to optimize signal routing for the controller die, which in turn may facilitate the semiconductor die assembly to operate at higher speed. Additionally, or alternatively, conductive traces coupling the controller die with the memory dies may be formed in regions of the package substrate where the support structures used to occupy. Such conductive traces may enable the controller die transmitting and/or receiving signals to/from the memory dies to support higher operating speed of the semiconductor die assembly.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1A illustrates a schematic cross-sectional diagram of a semiconductor die assembly 100. The semiconductor die assembly 100 includes a package substrate 105 with substrate bond pads 107 (also identified individually as substrate bond pads 107a/b). The semiconductor die assembly 100 includes a controller die 110 attached to the package substrate 105 through interconnects 112 (e.g., using flip-chip technology), as well as support structures 115 (also identified individually as support structures 115a/b) attached to the package substrate 105—e.g., using a first adhesive film 120. Top surfaces of the support structures 115 are aligned with that of the controller die 110 such that the support structures 115 in combination with the controller die 110 can provide a flat surface for attaching stacks of memory dies 125 (also identified individually as memory dies 125a-d).

The bottommost memory die (e.g., memory die 125d) is attached to the support structures 115 and the controller die 110—e.g., using a second adhesive film 121 (which may be the same as the first adhesive film 120 in some embodiments). The memory dies 125 of the stack are attached to each other using a third adhesive film 122 (which may be the same as the first adhesive film 120 in some embodiments).

The semiconductor die assembly 100 also includes bond wires 130 (also identified individually as bond wires 130*a/b*) connecting the substrate bond pads 107 to corresponding bond pads 127 (also identified individually as bond pads 127*a-d*) of the memory dies 125. The controller die 110 may communicate with the memory dies 125 through the bond wires 130 and conductive traces formed on the package substrate 105 (e.g., conductive traces 109 depicted in FIG. 1B). The semiconductor die assembly 100 also includes a mold structure 140 and external terminals 135 (also identified individually as external terminals 135*a-c*).

The semiconductor die assembly 100 depicted in FIG. 1A includes space 145 underneath the stacks of memory dies 125 that are filled with an encapsulating material of the mold structure 140. In some cases, the space 145 may not be ideally filled with the encapsulating material as depicted in FIG. 1A if flowing of the encapsulating material is obstructed by the support structures 115. For example, if the inlets of the encapsulating material are arranged such that advancing fronts of the encapsulating material do not face openings of the space 145—e.g., the advancing front of the encapsulating material being right side (or left side) of the support structure 115*a* (or the support structure 115*b*)—the space 145 may not be completely filled by the encapsulating material. As a result, the stacks of memory dies 125 may not be fully supported by the encapsulating material in some cases, which may in turn, may result in reliability issues for the memory dies 125.

In some cases, heights of the support structures 115 vary significantly enough to cause the encapsulating material entering into gaps between the support structures 115 and the adhesive film 121—e.g., mold ingression. For example, if the support structure 115*a* is taller than the height of the controller die 110 (or the height of the other support structures), the bottommost memory die 125*d* can be tilted (or unattached to the controller die 110) to leave a gap underneath the adhesive film 121 (e.g., between the adhesive film 121 and the support structure 115*a*, between the adhesive film 121 and the controller die 110). The encapsulating material may enter into the gap while the mold structure 140 is formed. The reduced area of the adhesive film 121 in contact with the support structure 115*a* (and/or with the controller die 110), in conjunction with the encapsulating material present in the gap in some cases, may lead to delamination between the support structure 115*a* and the adhesive film 121 (and the bottommost memory die 125*d* of the stack of memory dies).

Figure 1B:
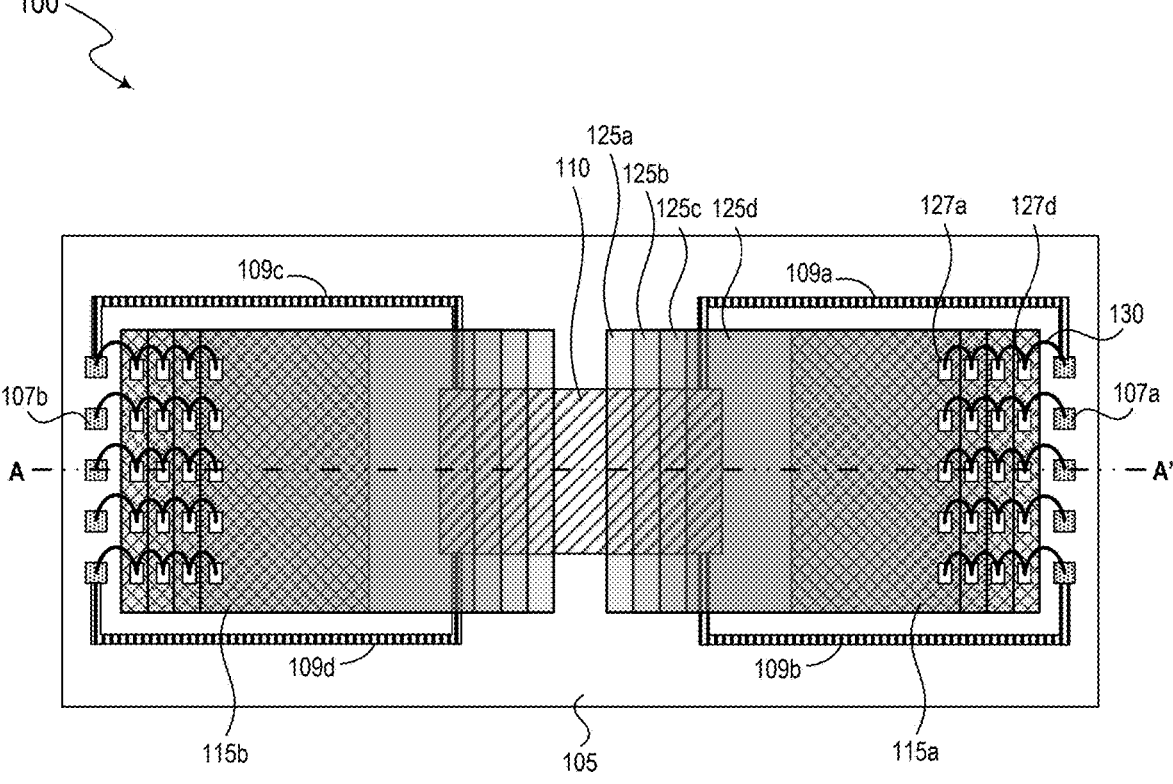

FIG. 1B illustrates a schematic top-down view diagram of the semiconductor die assembly 100. The schematic cross-sectional diagram of FIG. 1A corresponds to a cross-section view of the semiconductor die assembly 100 across the line AA' of FIG. 1B. As described above, the controller die 110 is attached to the package substrate 105 with the interconnects 112, and the controller die 110 communicates with the memory dies 125 through the bond wires 130 connected to the substrate bond pads 107 and through conductive traces 109 (also identified individually as conductive traces 109*a-d*) formed on the package substrate 105. In some cases, the support structure 115 attached to the package substrate 105 hinder (or otherwise interfere with) forming the shortest communication paths on the package substrate 105 between the interconnects 112 and the substrate bond pads 107. For example, conductive traces 109, several of which are depicted in FIG. 1B, may be routed (laid out) around the support structures 115. Such routing of the conductive traces 109 may be undesirable for the controller die 110 (and the semiconductor die assembly 100) to operate at high speed.

Figure 2A:
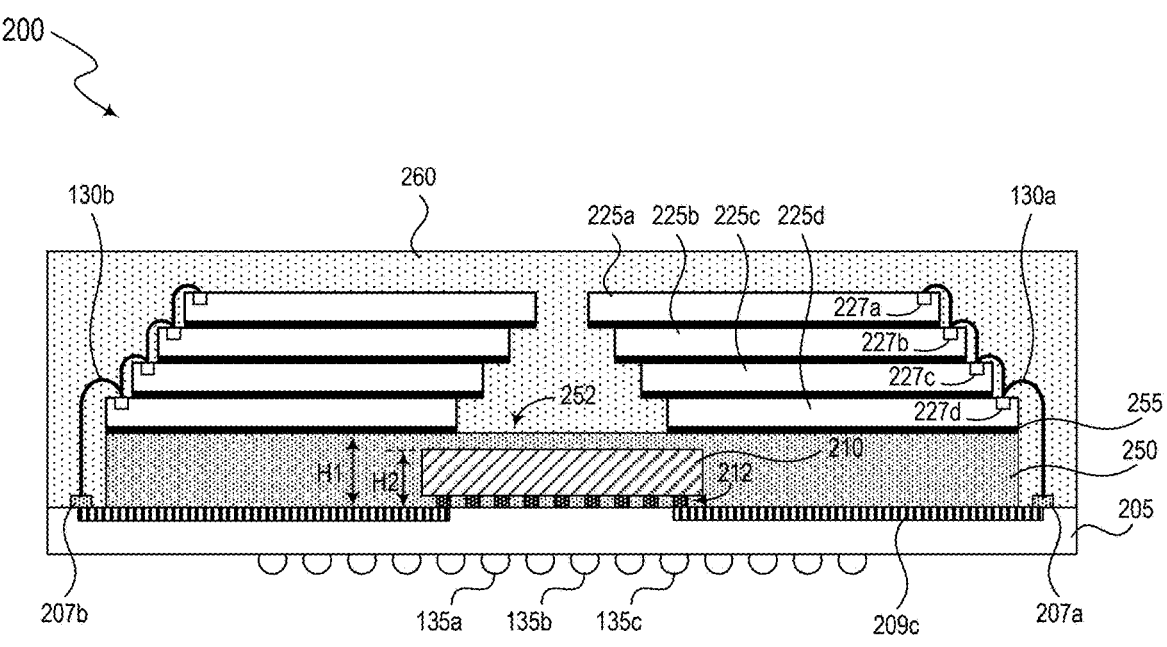
FIGS. 2A and 2B illustrate schematic diagrams of a semiconductor die assembly in accordance with embodiments of the present technology.

FIG. 2A illustrates a schematic cross-sectional diagram of a semiconductor die assembly 200 in accordance with embodiments of the present technology. The semiconductor die assembly 200 includes certain aspects of the semiconductor die assembly 100 described with reference to FIGS. 1A/B. For example, the semiconductor die assembly 200 includes a package substrate 205 with substrate bond pads 207 (also identified individually as substrate bond pads 207*a/b*) and a first semiconductor die 210 (e.g., the controller die 110) attached to the package substrate 205 through interconnects 212—e.g., using flip-chip technology.

The semiconductor die assembly 200 includes a first mold structure 250 formed on the package substrate 205. The first mold structure 250 may include encapsulating materials (e.g., molding materials, epoxy mold compounds (EMCs)). In some embodiments, a cavity of a mold frame may be filled with the encapsulating materials to form the first mold structure 250, where the cavity corresponds to at least a footprint of the first semiconductor die 210. The first mold structure 250 may be referred to as a monolithic mold structure—e.g., a mold structure formed as a single piece, a mold structure including a single unit. The first mold structure 250 may enclose the first semiconductor die 210. Also, the first mold structure 250 has a surface 252 facing away from the package substrate 205.

The semiconductor die assembly 200 may include one or more stacks of second semiconductor dies 225 (also identified individually as second semiconductor dies 225*a-d*) attached to the surface 252—e.g., using an adhesive film 255. The lowest second semiconductor die of the stack (e.g., second semiconductor die 225*d*) includes a bottom surface facing the package substrate 205, and the bottom surface of the lowest second semiconductor die of the stack can be completely supported by the first mold structure 250. In some embodiments, the second semiconductor dies include memory dies (e.g., the memory dies 125). Support structures (e.g., the support structures 115 described with reference to FIGS. 1A/B) are absent in the semiconductor die assembly 200 in view of the first mold structure 250 providing a level surface (even surface, flat surface, coplanar surface) for attaching the stacks of second semiconductor dies 225.

The first mold structure 250 depicted in FIG. 2A has a first height (denoted as H1) from the surface of the package substrate 205, which is greater than a second height (denoted as H2) of the first semiconductor die 210 from the surface of the package substrate 205. In some embodiments, the first mold structure 250 is formed using a mold frame having a cavity including at least a footprint of the first semiconductor die 210 such that filling the cavity with the encapsulating materials can form the first mold structure 250 enclosing the first semiconductor die 210. As a result of the first mold structure 250 completely enclosing the first semiconductor die 210 (and absence of support structures in the semiconductor die assembly 200), the stacks of second semiconductor dies 225 are attached only to the surface 252 of the first mold structure 250 in the embodiment illustrated in FIG. 2A.

The adhesive film 255 attaches the second semiconductor die 225*d* (or the stack of second semiconductor dies 225) to the surface 252 of the first mold structure 250. In some embodiments, the adhesive film 255 completely covers the bottom surface of the second semiconductor die 225*d*—e.g., the adhesive film 255 having the same size as the bottom surface. In some embodiments, the adhesive film 255 in its entirety is in contact with the surface 252 of the first mold structure 250. In some embodiments, the stack of second semiconductor dies 225 include at least two second semiconductor dies 225 attached to each other by an adhesive film. Further, an edge of an upper second semiconductor die (e.g., second semiconductor die 225a) extends past a corresponding edge of a lower second semiconductor die (e.g., second semiconductor die 225b) such that a plurality of bond pads (e.g., bond pads 227b) of the lower second semiconductor die is uncovered by the upper second semiconductor die.

In some embodiments, the entire adhesive film 255 (corresponding to the bottommost second semiconductor die 225d of the stack of second semiconductor dies 225) is in contact with the surface of the first mold structure 250. In some embodiments, the adhesive film 255 is configured to provide suitable bonding strength between the encapsulating material of the first mold structure 250 and the second semiconductor die 225d. In some embodiments, the adhesive film 255 is different than the adhesive films 120, 121, or 122. In other embodiments, the adhesive film 255 is the same as the adhesive films 120, 121, or 122. Further, the first mold structure 250 provides a level surface 252 (e.g., formed by filling the cavity of the mold frame) unlike the support structures 115 subject to the coplanarity issues described above. In this manner, the semiconductor die assembly 200 is expected to be less prone to experience challenges associated with the coplanarity issues—e.g., mold ingression, delamination of semiconductor dies from the support structures.

The semiconductor die assembly 200 includes bond wires (also identified individually as 130a/b) connecting the substrate bond pads 207 to corresponding bond pads 227 (also identified individually as bond pads 227a-d) of the second semiconductor dies 225. The semiconductor die assembly 200 also includes a second mold structure 260 and external terminals 135 (also identified individually as external terminals 135a-c). As described above, the semiconductor die assembly 200 does not include spaces (e.g., the space 145 created by the support structures 115 and the controller die 110), which may present difficulties for the encapsulating material to fill—e.g., the encapsulating material of the second mold structure 260 to fill. Accordingly, the stack of second semiconductor dies 225 is expected to have improved support from the first mold structure 250—e.g., when compared to the stack of memory dies 125 attached to the support structure 115. Further, the overall arrangement of the first mold structure 250 (encasing the first semiconductor die 210), the stacks of second semiconductor dies 225, and the bond wires 130 is expected to be more friendly for the encapsulating material of the second mold structure 260 when compared to the overall arrangement of the semiconductor die assembly 100 for the encapsulating material of the mold structure 140.

Figure 2B:
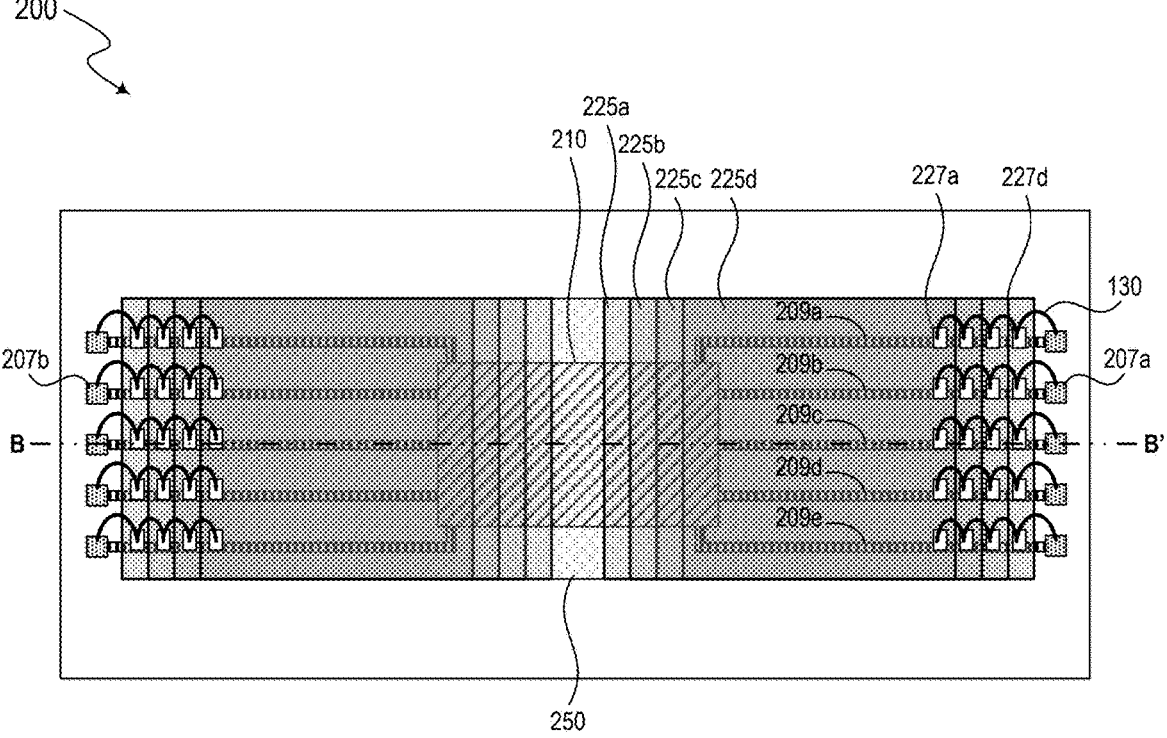

As with the controller die 110 of the semiconductor die assembly 100, the first semiconductor die 210 attached to the package substrate 205 communicates with the second semiconductor dies 225 through the bond wires 130 connected to the substrate bond pads 207 and through conductive traces (e.g., conductive traces 209 depicted in FIG. 2B) formed on the package substrate 205. As a result of eliminating support structures attached to the package substrate 205, however, forming shorter communication paths (e.g., signal paths) on the package substrate 205 between the interconnects 212 and the substrate bond pads 207 may become feasible. For example, conductive traces 209, several of which are depicted in FIG. 2B, are routed (laid out) between the substrate bond pads 207 from the interconnects 212 such that detouring of the conductive traces 209 around the support structures can be avoided. Such routing of the conductive traces 209 may facilitate the first semiconductor die 210 (and the semiconductor die assembly 200) to operate at high speed—e.g., at a higher speed than the controller die 110 (and the semiconductor die assembly 100).

FIG. 2B illustrates a schematic top-down view diagram of the semiconductor die assembly 200 in accordance with embodiments of the present technology. The schematic cross-sectional diagram of FIG. 2A corresponds to a cross-sectional view of the semiconductor die assembly 200 across the line BB' of FIG. 2B. As described above, the first semiconductor die 210 is attached to the package substrate 205 with the interconnects 212, and the first semiconductor die 210 communicates with the second semiconductor dies 225 through the bond wires 130 connected to the substrate bond pads 207 and through conductive traces 209 (also identified individually as conductive traces 209a-e) formed on the package substrate 205. In this manner, shorter communication paths (e.g., shorter than the conductive traces 109) between the interconnects 212 and the substrate bond pads 207 can be formed on the package substrate 205 to facilitate the first semiconductor die 210 (and the semiconductor die assembly 200) to operate at high operating speed—e.g., at operating speed higher than the semiconductor die assembly 100.

Figure 3:
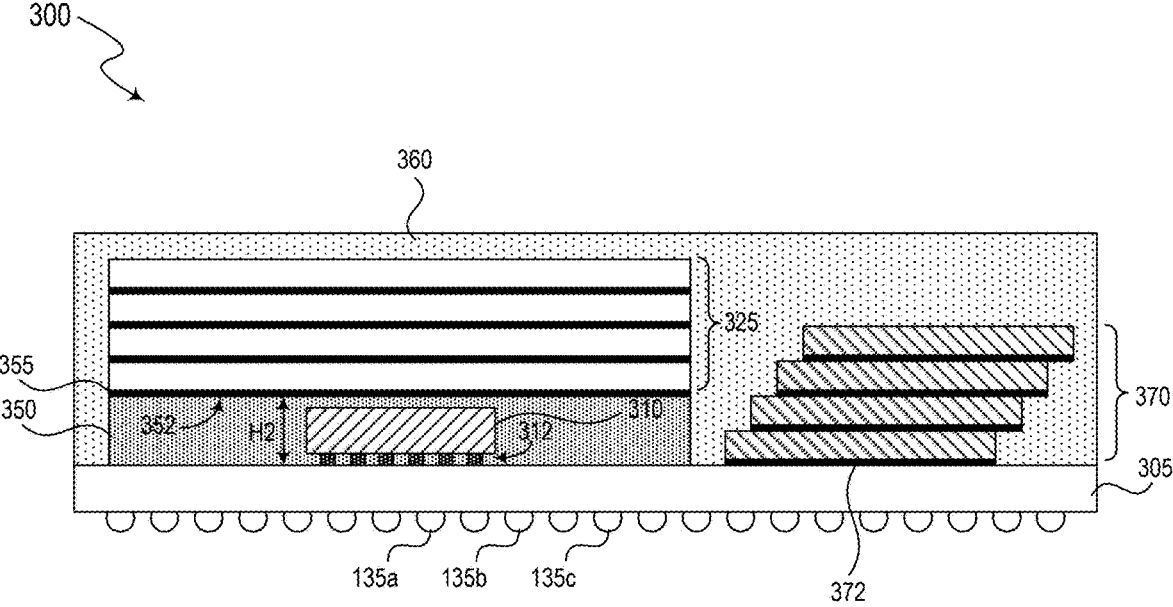
FIG. 3 illustrates a schematic diagram of a semiconductor die assembly in accordance with embodiments of the present technology.

FIG. 3 illustrates a schematic cross-sectional diagram of a semiconductor die assembly 300 in accordance with embodiments of the present technology. The semiconductor die assembly 300 includes aspects of the semiconductor die assembly 100 or the semiconductor die assembly 200 described with reference to FIGS. 1A and 2A. For example, the semiconductor die assembly 300 includes a package substrate 305 with substrate bond pads (not shown) and a first semiconductor die 310 (e.g., the controller die 110, the first semiconductor die 210) attached to the package substrate 305 through interconnects 312—e.g., using flip-chip technology.

The semiconductor die assembly 300 includes a first mold structure 350 formed on the package substrate 305. The first mold structure 350 may include encapsulating materials (e.g., molding materials, epoxy mold compounds (EMCs)). The first mold structure 350 may enclose the first semiconductor die 310. Also, the first mold structure 350 has a surface 352 facing away from the package substrate 305. The semiconductor die assembly 300 may include one or more stacks of second semiconductor dies 325 attached to the surface 352—e.g., using an adhesive film 355. In some embodiments, the second semiconductor dies include memory dies (e.g., the memory dies 125). Support structures (e.g., the support structures 115 described with reference to FIGS. 1A/B) are absent in the semiconductor die assembly 300 in view of the first mold structure 350 provides a level surface (even surface, flat surface, coplanar surface) for attaching the stacks of second semiconductor dies 325.

The package substrate 305 of the semiconductor die assembly 300 includes a region uncovered by the first mold structure 350, where one or more third semiconductor dies 370 are attached to the package substrate 305—e.g., using an adhesive film 372. In some embodiments, the bottommost third semiconductor die (e.g., third semiconductor die 370a) is directed attached to the package substrate 305. In some embodiments, the third semiconductor dies 370 include memory dies. In some embodiments, the second semiconductor dies 325 includes memory dies different than the third memory dies 370. In some embodiments, the first semiconductor die 310 corresponds to a controller die, the second semiconductor dies 325 correspond to volatile memory dies (e.g., DRAM dies), and the third semiconductor dies 370 correspond to non-volatile memory dies (e.g., NAND memory dies, PCM dies).

The semiconductor die assembly 300 includes a second mold structure 360 encasing the first mold structure 350 (and the first semiconductor die 310), the second semiconductor dies 325, the third semiconductor dies 370, and bond wires (not shown) connecting the second and third semiconductor dies to the substrate bond pads (not shown). The semiconductor die assembly 300 also includes external terminals 135 (also identified individually as external terminals 135*a*-*c*).

Although foregoing embodiments of semiconductor die assemblies (e.g., semiconductor die assembly 200, semiconductor die assembly 300) include mold structures (e.g., mold structure 250, mold structure 350) that completely enclose the first semiconductor dies (e.g., semiconductor die 210, semiconductor die 310), the present technology is not limited thereto. For example, after the mold structures are formed (e.g., by filling the cavities of the mold frame with encapsulating materials), excess encapsulating materials (i.e., encapsulating materials above the first semiconductor dies) can be removed—e.g., using grinding process, chemical-mechanical polish (CMP) process. As a result of removing the excess encapsulating materials above the first semiconductor dies, the surfaces of the mold structures can be aligned to the surface of the first semiconductor die (exposed as a result of removing the excess encapsulating materials). In this manner, overall heights of the semiconductor die assemblies can be reduced to provide smaller form factors. Subsequently, stacks of second semiconductor dies can be attached to the surface of the mold structures and the first semiconductor dies.

Figure 4A:
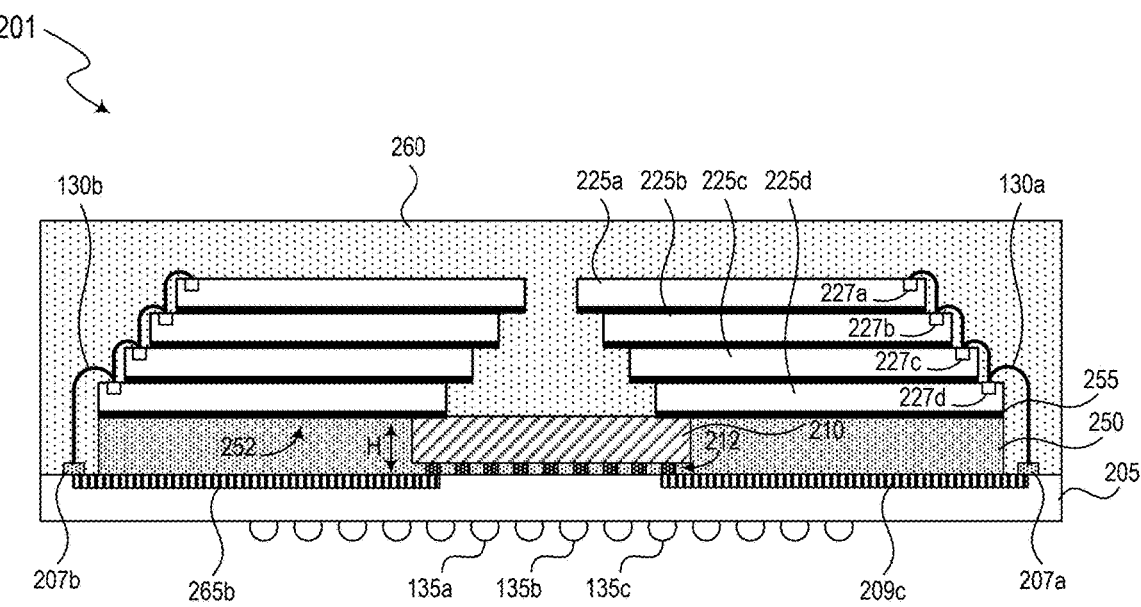
FIGS. 4A and 4B illustrate schematic diagrams of semiconductor die assemblies in accordance with embodiments of the present technology.

FIG. 4A illustrates a schematic diagram of a semiconductor die assembly 201 in accordance with embodiments of the present technology. The semiconductor die assembly 201 may be regarded as an alternative embodiment of the semiconductor die assembly 200 in that the first mold structure 250 is configured to have its surface 252 aligned to the surface of the first semiconductor die 210. In this regard, after forming the first mold structure 250 (e.g., by filling the cavity of the mold frame with the encapsulating materials), part of the first mold structure 250 above the first semiconductor die 210 (e.g., excess encapsulating materials above the first semiconductor die 210) is removed as described above. Subsequently, one or more stacks of second semiconductor dies 225 are attached to the surface 252 of the first mold structure 250 and to the first semiconductor die 210 using the adhesive film 255. As a result of removing the excess encapsulating material, both the first mold structure 250 and the first semiconductor die 210 have the same height (denoted as H) from the package substrate 205.

Figure 4B:
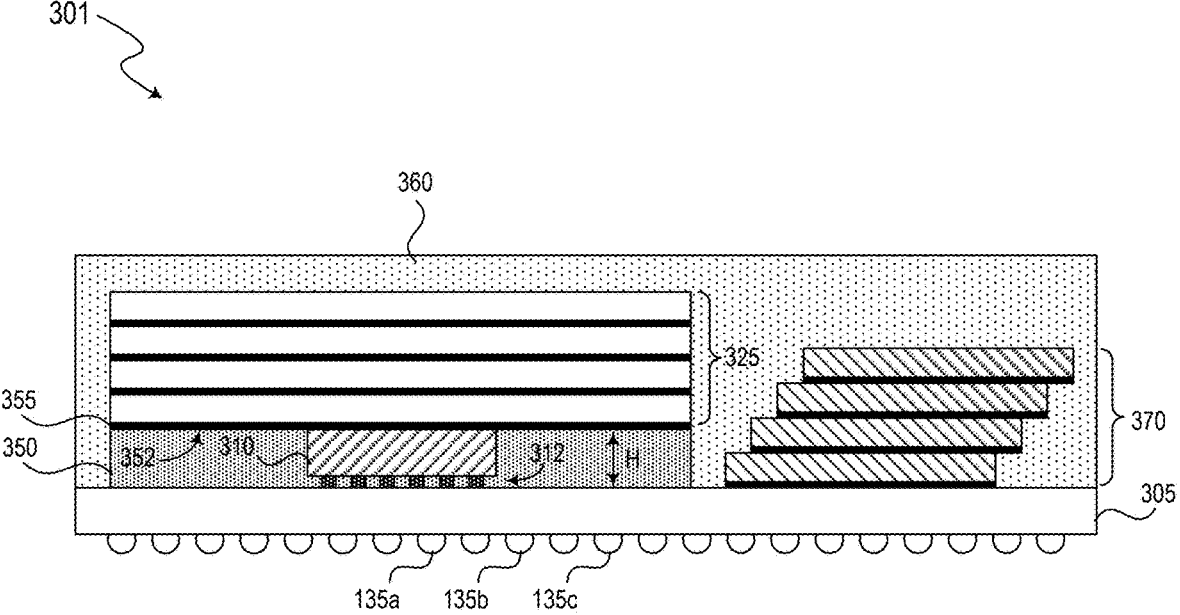

FIG. 4B illustrates a schematic diagram of a semiconductor die assembly 301 in accordance with embodiments of the present technology. The semiconductor die assembly 301 may be regarded as an alternative embodiment of the semiconductor die assembly 300 in that the first mold structure 350 is configured to have its surface 352 aligned to the surface of the first semiconductor die 310 as described above. Subsequently, one or more stacks of second semiconductor dies 325 are attached to the surface 352 of the first mold structure 350 and to the first semiconductor die 310 using the adhesive film 355. As a result of removing the excess encapsulating material, both the first mold structure 350 and the first semiconductor die 310 have the same height (denoted as H) from the package substrate 205.

Figure 5A:
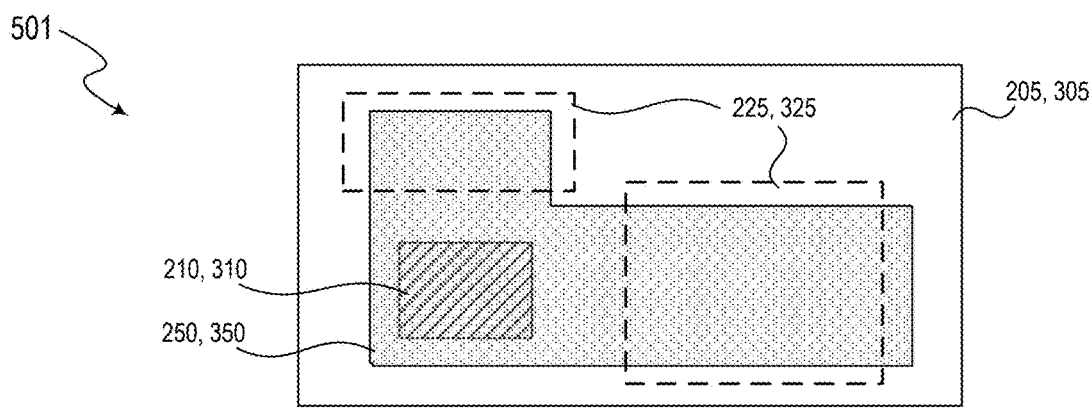
FIGS. 5A through 5C illustrate schematic diagrams of semiconductor die assemblies in accordance with embodiments of the present technology.
Figure 5B:
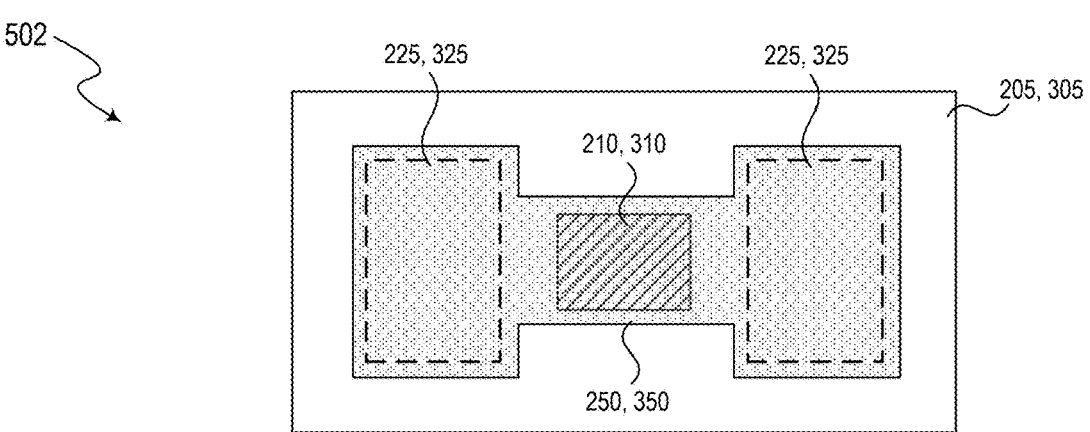
Figure 5C:
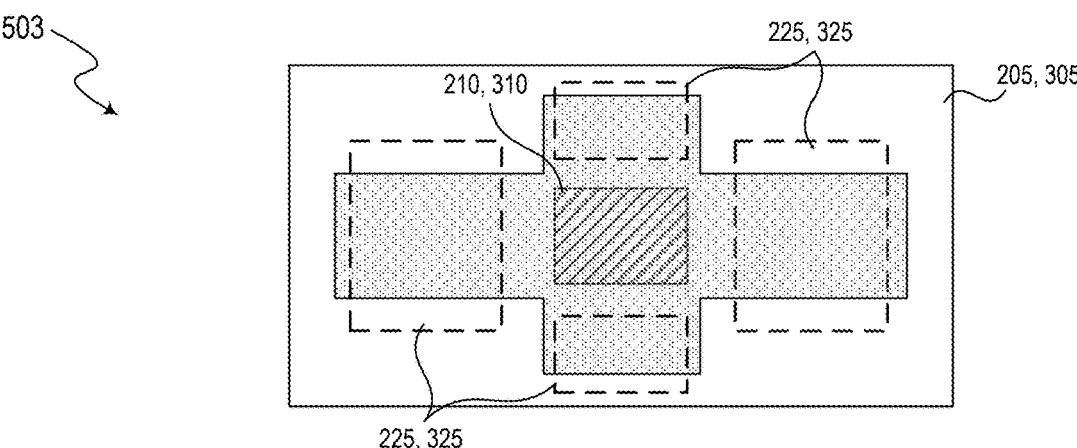

The present technology provides for a variety of placement arrangements for the first semiconductor die (e.g., a memory controller die) and the second semiconductor dies (e.g., memory dies) on the package substrate as schematically illustrated in FIGS. 5A through 5C depicting semiconductor die assemblies 501, 502, and 503, respectively. In some embodiments, the first semiconductor die is placed in a central region of the package substrate—e.g., as in the semiconductor die assemblies 502 and 503. In other embodiments, the first semiconductor die is placed in a location away from a central region of the package substrate—e.g., as in the semiconductor die assembly 501. The first mold structures may have various shapes based on where the second semiconductor dies are placed as depicted in FIGS. 5A-5C. Further, more than one first mold structures (e.g., separated from each other) can be formed on a package substrate. In some embodiments, one or more first mold structures include more than one semiconductor dies. In some embodiments, one or more first mold structures do not include any semiconductor die. In some embodiments, one or more first mold structures include passive components (e.g., capacitors) for the semiconductor die assembly. In some embodiments, one or more first mold structures include nothing but the encapsulating materials.

FIGS. 6A through 6D illustrate stages of a process for forming a semiconductor device assembly (e.g., the semiconductor die assembly 200 described with reference to FIGS. 2A and 2B) in accordance with embodiments of the present technology.

Figure 6A:
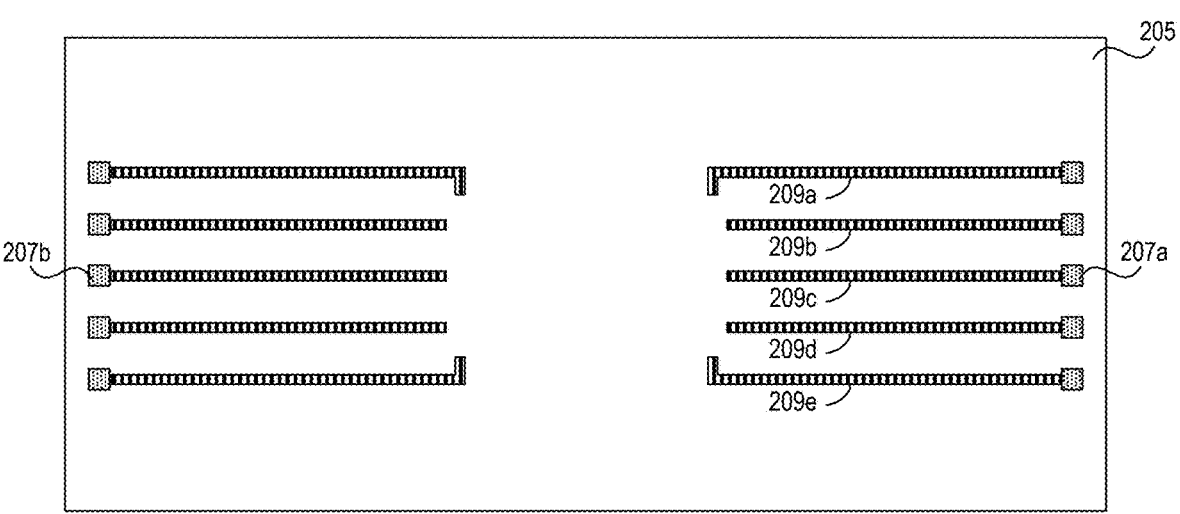
FIGS. 6A through 6D illustrate stages of a process for forming a semiconductor device assembly in accordance with embodiments of the present technology.
Figure 6B:
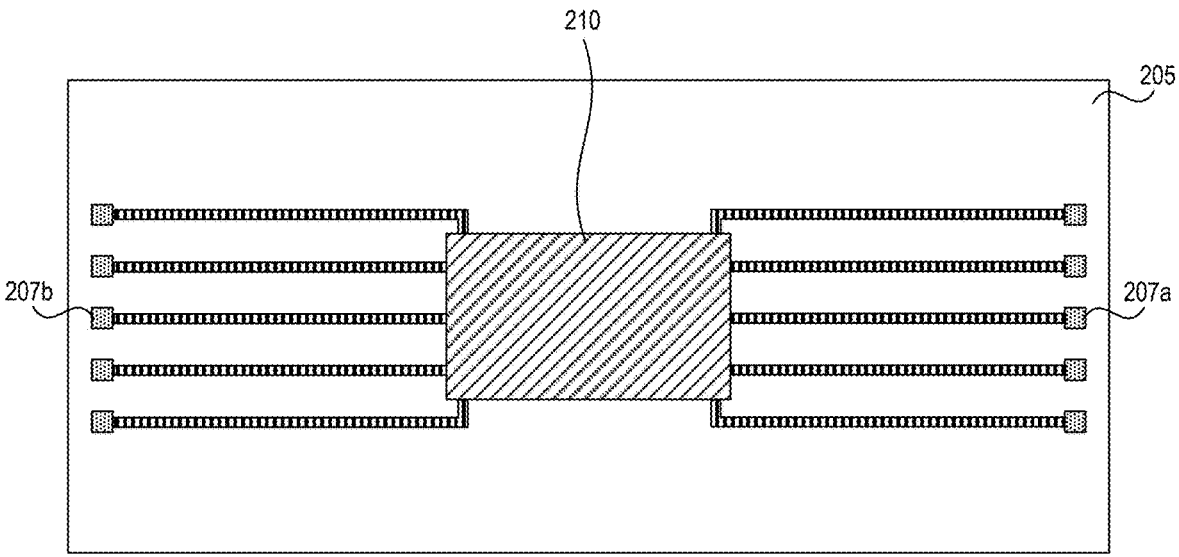

FIG. 6A illustrates a package substrate 205 with substrate bond pads 207 (also identified individually as substrate bond pads 207*a/b*). The package substrate 205 also includes conductive traces 209 (also identified individually as conductive traces 209*a*-*e*) connected to the substrate bond pads 207. FIG. 6B illustrates a first semiconductor die 210 attached to the package substrate 205 through interconnects 212 (not shown)—e.g., using flip-chip bonding technology. When the first semiconductor die 210 is attached to the package substrate 205 through the interconnects 212, the conductive traces 209 couple individual interconnects 212 to corresponding substrate bond pads 207. As shown in FIG. 6B, the first semiconductor die 210 is located in a central region of the package substrate 205 and the conductive traces 209 are located in a peripheral region of the package substrate 205 next to the central region.

Figure 6C:
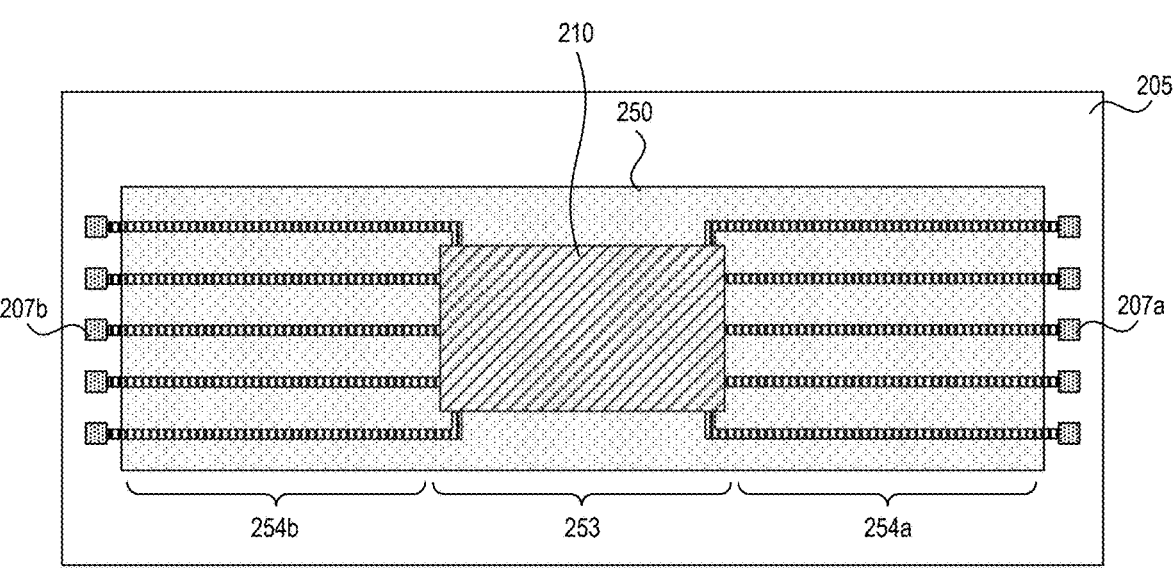

FIG. 6C illustrates that a first mold structure 250 is formed on the package substrate 205. In some embodiments, the first mold structure 250 encloses the first semiconductor die 210—e.g., by filling a cavity of a mold frame where the cavity corresponds at least to the first semiconductor die 210 (e.g., including a footprint of the first semiconductor die 210). The first mold structure 250 may be referred to as a monolithic mold structure—e.g., a mold structure formed as a single piece or a single unit. In some embodiments, the first semiconductor die 210 may not be exposed—e.g., the first mold structure 250 enclosing the first semiconductor die 210. In other embodiments, excess encapsulating materials above the first semiconductor die 210 is removed to expose the top surface of the first semiconductor die 210.

The first mold structure 250 includes a region 253 (or a molding region 253) including a footprint of the first semiconductor die 210. The molding region 253 of the first mold structure 250 may also be referred to as a central region, a medial region, or a middle region of the first mold structure 250 in view of the location of the first semiconductor die 210. The first mold structure 250 includes additional regions 254 (or molding regions 254) (also identified individually as regions or molding regions 254*a/b*) next to the region 253.

The molding regions 254 of the first mold structure 250 may also be referred to as peripheral regions, outer regions, or lateral regions.

Figure 6D:
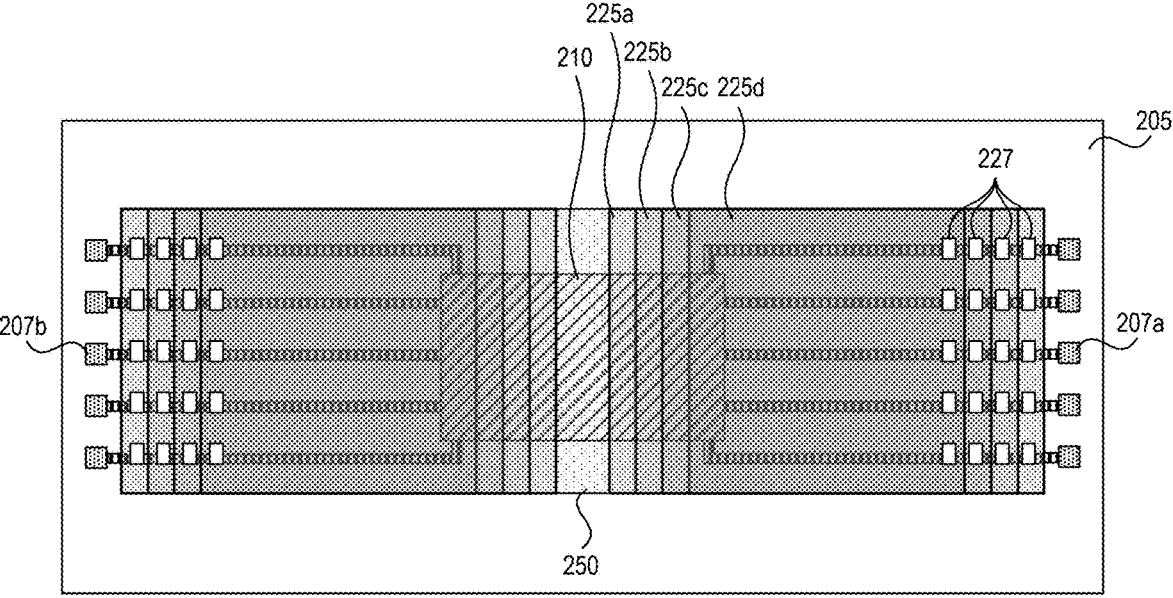

FIG. 6D illustrates that stacks of second semiconductor dies 225 are attached to the first mold structure 250 (and also to the first semiconductor die 210 in some embodiments)—e.g., using an adhesive film 255 (not shown). Subsequently, bond wires (e.g., bond wires 130, not shown) are formed to connect the bond pads 227 of the second semiconductor dies 225 to the substrate bond pads 207. The second mold structure 260 encapsulates the stacks of second semiconductor dies 225, bond wires, and the first mold structure 250 including the first semiconductor die 210. In some embodiments, the second mold structure 260 may be formed by filling a cavity of a mold frame where the cavity corresponds to a semiconductor device assembly (e.g., the semiconductor die assembly 200 described with reference to FIGS. 2A and 2B). The second mold structure 260 may be referred to as a monolithic mold structure—e.g., a mold structure formed as a single piece or a single unit.

Figure 7:
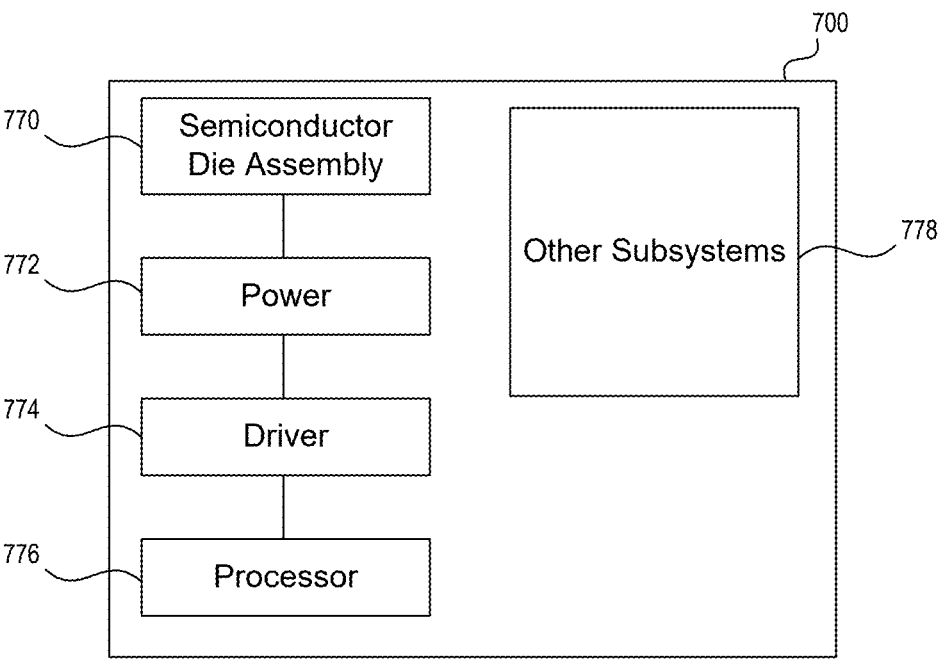
FIG. 7 is a block diagram schematically illustrating a system including a semiconductor die assembly in accordance with embodiments of the present technology.

FIG. 7 is a block diagram schematically illustrating a system 700 including a semiconductor die assembly in accordance with embodiments of the present technology. The system 700 can include a semiconductor device assembly 770, a power source 772, a driver 774, a processor 776, and/or other subsystems or components 778. The semiconductor die assembly 200, 201, 300, or 301 described with reference to FIGS. 2A through 6D may be included in the semiconductor device assembly 770 of the system 700.

The semiconductor device assembly 770 can have features generally similar to the semiconductor die assembly 200, 201, 300, or 301. For example, the semiconductor device assembly 770 includes a package substrate, a first semiconductor die attached to the package substrate, a first monolithic mold structure on the package substrate, the first monolithic mold structure enclosing the first semiconductor die and having a surface facing away from the package substrate, a stack of second semiconductor dies attached to the surface of the first monolithic mold structure, where a lowest second semiconductor die of the stack includes a bottom surface facing the package substrate, the bottom surface being completely supported by the first monolithic mold structure, and a second monolithic mold structure enclosing the first monolithic mold structure and the stack of second semiconductor dies. In some embodiments, the semiconductor device assembly 770 further includes an adhesive film attaching the stack of second semiconductor dies to the surface of the first monolithic mold structure, where the adhesive film completely covers the bottom surface of the lowest second semiconductor die of the stack. In some embodiments, the surface of the first monolithic mold structure has a first height from the package substrate and the first semiconductor die has a second height from the package substrate, where the second height is less than the first height.

The resulting system 700 can perform any of a wide variety of functions, such as memory storage, data processing, and/or other suitable functions. Accordingly, representative systems 700 can include, without limitation, handheld devices (e.g., mobile phones, tablets, digital readers, and digital audio players), computers, and appliances. Components of the system 700 may be housed in a single unit or distributed over multiple, interconnected units (e.g., through a communications network). The components of the system 700 can also include remote devices and any of a wide variety of computer readable media.

FIG. 8 is a flowchart 800 of a method of forming a semiconductor device assembly in accordance with embodiments of the present technology. The flowchart 800 may include aspects of methods as described with reference to FIGS. 1A through 6D.

The method includes attaching a first semiconductor die to a package substrate including a plurality of substrate bond pads (box 810). The method further includes forming a first monolithic mold structure on the package substrate, the first monolithic mold structure enclosing the first semiconductor die and having a surface facing away from the package substrate (box 815). The method further includes attaching a stack of second semiconductor dies on the first monolithic mold structure, where a lowest second semiconductor die of the stack includes a bottom surface facing the package substrate, the bottom surface being completely supported by the first monolithic mold structure (box 820). The method further includes forming a second monolithic mold structure enclosing the first monolithic mold structure and the stack of second semiconductor dies (box 825).

In some embodiments, the method further includes forming, prior to forming the second monolithic mold structure, a plurality of bond wires connecting individual substrate bond pads of the plurality to corresponding bond pads of the second semiconductor dies of the stack, where the plurality of substrate bond pads is located in an area of the package substrate uncovered by the first monolithic mold structure. In some embodiments, the method further includes attaching, prior to forming the second monolithic mold structure, at least one third semiconductor die to an area of the package substrate uncovered by the first monolithic mold structure.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
a package substrate;
a first semiconductor die directly attached to an upper surface of the package substrate by a plurality of interconnects disposed between the first semiconductor die and the package substrate;
a first monolithic mold structure directly contacting the upper surface of the package substrate, the first monolithic mold structure completely enclosing the first semiconductor die, having a plurality of vertical sidewalls laterally spaced apart from the first semiconductor die, and having a planar surface above the first semiconductor die and facing away from the package substrate;
a stack of second semiconductor dies directly attached to the planar surface of the first monolithic mold structure by an adhesive film, wherein a lowest second semiconductor die of the stack includes a vertical sidewall coplanar with one of the plurality of vertical sidewalls of the first monolithic mold structure and a bottom surface facing the package substrate, the bottom surface being completely supported by the first monolithic mold structure; and
a second monolithic mold structure directly contacting the upper surface of the package substrate and the planar surface of the first monolithic mold structure, and enclosing the first monolithic mold structure and the stack of second semiconductor dies,
wherein the stack of second semiconductor dies is a first stack of second semiconductor dies, and wherein the semiconductor die assembly further includes a second stack of second semiconductor dies attached to the planar surface of the first monolithic mold structure.

2. The semiconductor die assembly of claim 1, wherein the adhesive film completely covers the bottom surface of the lowest second semiconductor die of the stack.

3. The semiconductor die assembly of claim 1, wherein the first monolithic mold structure comprises a first molding region including a footprint of the first semiconductor die and one or more second molding regions next to the first molding region.

4. The semiconductor die assembly of claim 3, wherein one or more substrate regions of the package substrate corresponding to the one or more second molding regions of the first monolithic mold structure include conductive traces coupled to the first semiconductor die, the conductive traces configured to provide signal paths for the first semiconductor die.

5. The semiconductor die assembly of claim 1, wherein the planar surface of the first monolithic mold structure has a first height from the package substrate and the first semiconductor die has a second height from the package substrate, the second height being less than the first height.

6. The semiconductor die assembly of claim 1, wherein the package substrate comprises an area uncovered by the first monolithic mold structure, the area including at least one third semiconductor die attached to the package substrate.

7. The semiconductor die assembly of claim 1, wherein the package substrate comprises an area uncovered by the first monolithic mold structure, the area including a plurality of substrate bond pads connected to a plurality of bond pads of the second semiconductor dies of the stack by a plurality of bond wires.

8. The semiconductor die assembly of claim 1, wherein the stack of second semiconductor dies include at least two second semiconductor dies attached to each other by an adhesive film, and wherein an edge of an upper second semiconductor die extends past a corresponding edge of a lower second semiconductor die such that a plurality of bond pads of the lower second semiconductor die is uncovered by the upper second semiconductor die.

9. The semiconductor die assembly of claim 1, wherein the first semiconductor die includes a memory controller die and the second semiconductor dies include semiconductor memory dies.

10. A method, comprising:
directly attaching a first semiconductor die to an upper surface of a package substrate by a plurality of interconnects disposed between the first semiconductor die and the package substrate, the package substrate including a plurality of substrate bond pads;
forming a first monolithic mold structure directly contacting the upper surface of the package substrate, the first monolithic mold structure enclosing the first semiconductor die and having a planar surface facing away from the package substrate;
directly attaching a stack of second semiconductor dies to the planar surface of the first monolithic mold structure with an adhesive film, wherein a lowest second semiconductor die of the stack includes a bottom surface facing the package substrate, the bottom surface being completely supported by the first monolithic mold structure; and
forming a second monolithic mold structure directly contacting the upper surface of the package substrate and the planar surface of the first monolithic mold structure, and enclosing the first monolithic mold structure and the stack of second semiconductor dies.

11. The method of claim 10, further comprising:
forming, prior to forming the second monolithic mold structure, a plurality of bond wires connecting individual substrate bond pads of the plurality to corresponding bond pads of the second semiconductor dies of the stack, wherein the plurality of substrate bond pads is located in an area of the package substrate uncovered by the first monolithic mold structure.

12. The method of claim 10, further comprising:

attaching, prior to forming the second monolithic mold structure, at least one third semiconductor die to an area of the package substrate uncovered by the first monolithic mold structure.

13. A semiconductor die assembly, comprising:

a package substrate;

a controller die directly attached to an upper surface the package substrate by a plurality of interconnects disposed between a first semiconductor die and the package substrate;

a first monolithic mold structure directly contacting the upper surface of the package substrate, the first monolithic mold structure completely enclosing the controller die, having a plurality of vertical sidewalls laterally spaced apart from the first semiconductor die, and having a planar surface above the controller die and facing away from the package substrate;

a stack of memory dies directly attached to the planar surface of the first monolithic mold structure by an adhesive film, wherein a lowest second semiconductor die of the stack includes a vertical sidewall coplanar with one of the plurality of vertical sidewalls of the first monolithic mold structure and a bottom surface facing the package substrate, the bottom surface being completely supported by the first monolithic mold structure; and a second monolithic mold structure directly contacting the upper surface of the package substrate and the planar surface of the first monolithic mold structure, and enclosing the first monolithic mold structure and the stack of memory dies.

14. The semiconductor die assembly of claim 13, wherein the adhesive film completely covers the bottom surface of the lowest second semiconductor die of the stack.

15. The semiconductor die assembly of claim 13, wherein the first monolithic mold structure comprises a first molding region including a footprint of the controller die and one or more second molding regions next to the first molding region.

16. The semiconductor die assembly of claim 15, wherein one or more substrate regions of the package substrate corresponding to the one or more second molding regions of the first monolithic mold structure include conductive traces coupled to the controller die, the conductive traces configured to provide signal paths for the controller die.

17. The semiconductor die assembly of claim 13, wherein the planar surface of the first monolithic mold structure has a first height from the package substrate and the controller die has a second height from the package substrate, the second height being less than the first height.

18. The semiconductor die assembly of claim 13, wherein the package substrate comprises an area uncovered by the first monolithic mold structure, the area including at least one second memory die attached to the package substrate, and wherein the at least one second memory die is a different kind than the memory dies of the stack.

19. The semiconductor die assembly of claim 13, wherein the package substrate comprises an area uncovered by the first monolithic mold structure, the area including a plurality of substrate bond pads coupled to a plurality of bond pads of the stack of memory dies by a plurality of bond wires.

* * * * *